(12) United States Patent
Hattori (10) Patent No.: US 11,561,617 B2
(45) Date of Patent: Jan. 24, 2023

(54) INPUT APPARATUS AND INPUT METHOD (71) Applicant: KYOCERA Corporation, Kyoto (JP)

(72) Inventor: Shigeto Hattori, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 370 days.

(21) Appl. No.: 15/777,554

(22) PCT Filed: Nov. 8, 2016

(86) PCT No.: PCT/JP2016/083115
§ 371 (c)(1),
(2) Date: May 18, 2018

(87) PCT Pub. No.: WO2017/090425
PCT Pub. Date: Jun. 1, 2017

(65) Prior Publication Data
US 2018/0329496 A1  Nov. 15, 2018

(30) Foreign Application Priority Data

Nov. 27, 2015 (JP) .............................. JP2015-232191

(51) Int. Cl.
G06F 3/01 (2006.01)
G06F 3/0338 (2013.01)
G06F 3/02 (2006.01)
H01L 41/04 (2006.01)

(52) U.S. Cl.
CPC ................ *G06F 3/016* (2013.01); *G06F 3/01* (2013.01); *G06F 3/0227* (2013.01); *G06F 3/0338* (2013.01); *H01L 41/042* (2013.01)

(58) Field of Classification Search
CPC .......... G06F 3/01; G06F 3/016; G06F 3/0227; G06F 3/0338; G06F 3/41; H01L 41/042
See application file for complete search history.

(56) References Cited

U.S. PATENT DOCUMENTS

| 7,946,183 | B2 | 5/2011 | Sugahara | |
|---|---|---|---|---|
| 9,046,947 | B2 | 6/2015 | Takeda et al. | |
| 9,627,605 | B2 | 4/2017 | Ando et al. | |
| 2009/0084190 | A1 | 4/2009 | Sugahara | |
| 2010/0045624 | A1* | 2/2010 | Hisatsugu | B60H 1/00985 345/173 |
| 2010/0156844 | A1* | 6/2010 | Paleczny | G06F 3/016 345/174 |
| 2011/0127880 | A1 | 6/2011 | Murphy et al. | |
| 2011/0242064 | A1* | 10/2011 | Ono | B60K 35/00 345/184 |

(Continued)

FOREIGN PATENT DOCUMENTS

| JP | H05-182559 A | 7/1993 |
|---|---|---|
| JP | H09-237152 A | 9/1997 |

(Continued)

*Primary Examiner* — Temesghen Ghebretinsae
*Assistant Examiner* — Sosina Abebe
(74) *Attorney, Agent, or Firm* — Studebaker & Brackett PC (57) ABSTRACT An input apparatus includes an operation interface configured to receive an input operation from a user, a piezoelectric element attached to the operation interface, and a controller configured to acquire output based on the input operation to the operation interface from the piezoelectric element and to execute different control with respect to a controlled apparatus in accordance with the output.

5 Claims, 6 Drawing Sheets (56) References Cited

U.S. PATENT DOCUMENTS

| | | |
|---|---|---|
| 2013/0215080 A1 | 8/2013 | Takeda et al. |
| 2014/0049137 A1 | 2/2014 | Ando et al. |
| 2016/0185309 A1* | 6/2016 | Di Censo ............... B60K 35/00 701/49 |
| 2016/0342215 A1* | 11/2016 | Endo ....................... G06F 3/016 |
| 2017/0090572 A1* | 3/2017 | Holenarsipur ........ G06F 3/0362 |
| 2017/0186939 A1 | 6/2017 | Ando et al. |

FOREIGN PATENT DOCUMENTS

| | | |
|---|---|---|
| JP | H09-244801 A | 9/1997 |
| JP | 2004-213341 A | 7/2004 |
| JP | 2005-100917 A | 4/2005 |
| JP | 2009-085812 A | 4/2009 |
| JP | 2010-147619 A | 7/2010 |
| JP | 2014-016871 A | 1/2014 |
| JP | 5452729 B2 | 3/2014 |
| JP | 2015-057822 A | 3/2015 |

* cited by examiner

INPUT APPARATUS AND INPUT METHOD

CROSS-REFERENCE TO RELATED APPLICATION

The present application claims priority to and the benefit of Japanese Patent Application No. 2015-232191 filed Nov. 27, 2015, the entire contents of which are incorporated herein by reference.

TECHNICAL FIELD

The present disclosure relates to an input apparatus and an input method.

BACKGROUND

In industrial applications, various switches have been used for input of control signals with respect to a variety of controlled apparatuses.

SUMMARY

An input apparatus according to an embodiment includes an operation interface, a piezoelectric element, and a controller. The operation interface is configured to receive an input operation from a user. The piezoelectric element is attached to the operation interface. The controller is configured to acquire output based on the input operation to the operation interface from the piezoelectric element and to execute different control with respect to a controlled apparatus in accordance with the output.

An input method according to an embodiment is an input method for an apparatus including an operation interface configured to receive an input operation from a user, a piezoelectric element attached to the operation interface, and a controller. The input method includes acquiring, using the controller, output based on the input operation to the operation interface from the piezoelectric element and executing different control with respect to a controlled apparatus in accordance with the output.

DETAILED DESCRIPTION

Depending on the nature of the controlled apparatus that is controlled by input operations to the switch, operability may increase by having the control of the controlled apparatus follow an input operation to the switch in an analog manner. The present disclosure is based on these considerations and aims to provide an input apparatus and input method that can improve operability.

A switch configured to include a piezoelectric element is an example of an appropriate switch for causing the control of the controlled apparatus to follow an input operation to the switch in an analog manner. Piezoelectric elements are used in apparatuses such as the touch panel apparatus. An input apparatus according to an embodiment is, for example, configured as a switch that includes a piezoelectric element.

An embodiment is described below in detail with reference to the drawings.

Figure 1:
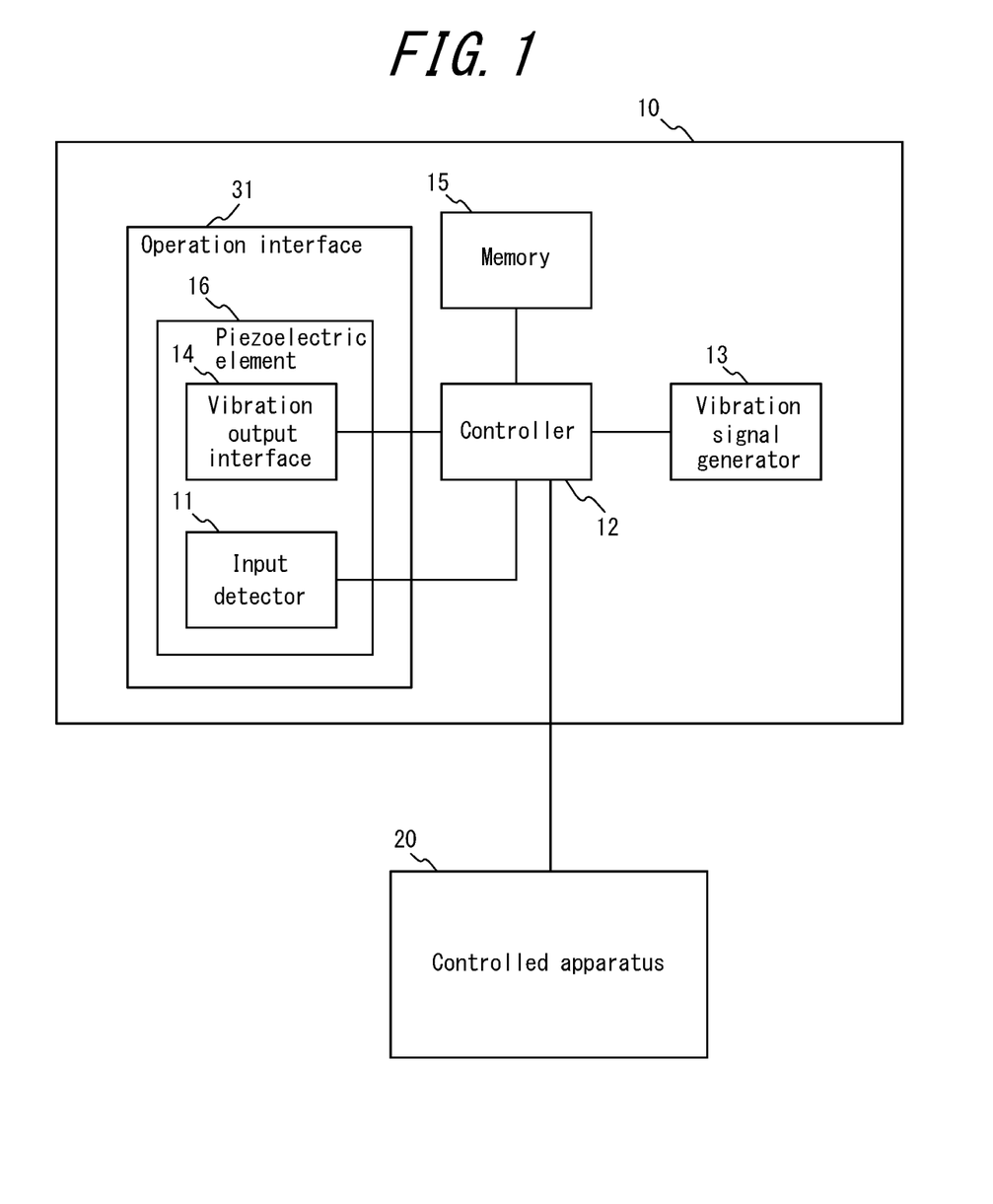
FIG. 1 is a functional block diagram illustrating the schematic configuration of an input apparatus according to a first embodiment.

FIG. 1 is a functional block diagram schematically illustrating the configuration of an input apparatus according to a first embodiment. An input apparatus 10 includes an input detector 11, a controller 12, a vibration signal generator 13, a vibration output interface 14, and a memory 15. The input apparatus 10 functions as a switch for receiving input operations to control a controlled apparatus 20. In other words, on the basis of an input operation to the input apparatus 10, the input apparatus 10 outputs a control signal for controlling the controlled apparatus 20.

In the present embodiment, the input detector 11 and the vibration output interface 14 are configured using one piezoelectric element 16. The piezoelectric element 16 is, for example, attached to an operation interface 31 for receiving input operations from the user.

The piezoelectric element 16 is formed by an element that, upon application of an electric signal (voltage), expands and contracts or bends in accordance with the electromechanical coupling coefficient of its constituent material. Piezoelectric elements made of ceramic or crystal elements, for example, may be used. The piezoelectric element 16 may be a unimorph, bimorph, or laminated piezoelectric element. Examples of a laminated piezoelectric element include a laminated bimorph element with layers of bimorph and a stacked element having a laminated structure formed by a plurality of dielectric layers composed of, for example, lead zirconate titanate (PZT) and electrode layers disposed between the dielectric layers. Unimorph expands and contracts upon application of an electric signal. Bimorph bends upon application of an electric signal. A stacked laminated piezoelectric element expands and contracts along the lamination direction upon application of an electric signal. In the present embodiment, the piezoelectric element 16 is described below as being a stacked laminated piezoelectric element. The user performs predetermined input operations on the piezoelectric element 16.

The input detector 11 detects input operations to the input apparatus 10. In other words, the input detector 11 detects user input operations on the input apparatus 10, which is a switch. The input detector 11 outputs a voltage signal to the controller 12 in response to the detected input operation. The input detector 11 outputs different voltage signals in accordance with the direction of displacement (expansion or contraction) of the piezoelectric element 16, for example. Specifically, the input detector 11 outputs positive and negative (i.e. two types of) voltage signals in accordance with the displacement direction of the piezoelectric element 16. The input detector 11 thus outputs voltage signals of different polarity in accordance with the displacement direction of the piezoelectric element 16. The input detector 11 may further change the amplitude of the voltage signal in accordance with the magnitude of displacement (expansion or contraction) of the piezoelectric element 16.

The controller 12 is a processor that controls and manages the input apparatus 10 overall, including the functional blocks of the input apparatus 10. The controller 12 is a processor such as a central processing unit (CPU) that executes a program with prescribed control procedures. Such a program may, for example, be stored in the memory 15, on an external storage medium, or the like.

On the basis of a voltage signal acquired from the input detector 11, the controller 12 generates a control signal for controlling the controlled apparatus 20 and outputs the control signal. Specifically, the controller 12 performs different control in accordance with the voltage signal acquired from the input detector 11. The control performed by the controller 12 is described in detail below.

On the basis of the voltage signal acquired by the controller 12 from the input detector 11, the vibration signal generator 13 generates a vibration signal to be supplied to the vibration output interface 14. For example, the vibration signal generator 13 generates the vibration signal by referring to a plurality of parameter tables, stored in the memory 15, for providing a tactical sensation. The parameter tables include various parameters such as the number of push stages, the number of release stages, a push threshold, a release threshold, a push vibration pattern, a release vibration pattern, and vibration intensity. The signal generated by the vibration signal generator 13 is supplied to the vibration output interface 14 through the controller 12.

The vibration output interface 14 outputs vibration on the basis of the vibration signal input from the vibration signal generator 13 through the controller 12. Specifically, the piezoelectric element 16 vibrates by the vibration output interface 14 causing the piezoelectric element 16 to expand and contract. Vibration of the vibration output interface 14 provides a tactile sensation to the user, who can learn that a predetermined input operation has been supplied to the input apparatus 10.

The memory 15 is, for example, a semiconductor memory or the like. The memory 15 stores a variety of information, programs for causing the input apparatus 10 to operate, and the like and also functions as a working memory. For example, the memory 15 stores a parameter table to be referred to when the vibration signal generator 13 generates a vibration signal.

The input operations by the user to the input apparatus 10 and the control in the controlled apparatus 20 are described below with examples. Here, an example is described in which the input apparatus 10 is a power window switch of a vehicle, and the controlled apparatus 20 is a power window controlled on the basis of input operations to the input apparatus 10. The power window includes a driving motor, for example, for raising and lowering the power window in the directions in which the power window opens (opening direction) and closes (closing direction).

Figure 2A:
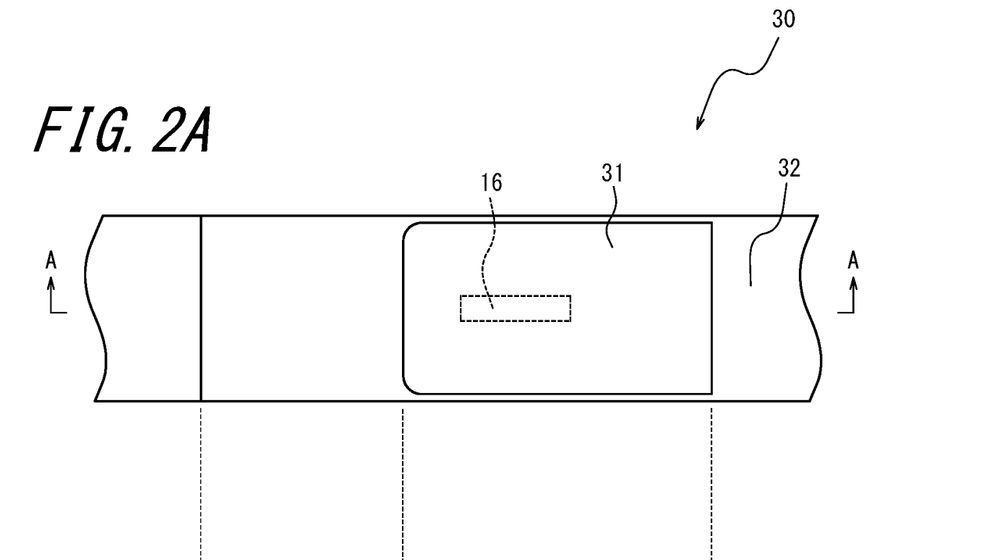
FIGS. 2A and 2B schematically illustrate a power window switch in which the input apparatus in FIG. 1 is used.
Figure 2B:
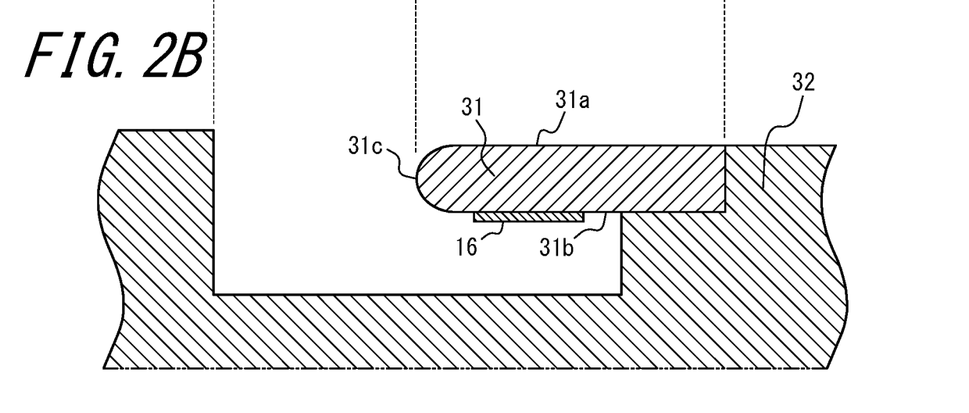

FIGS. 2A and 2B schematically illustrate a power window switch in which the input apparatus 10 in FIG. 1 is used. FIG. 2A is a top view of the power window switch 30, and FIG. 2B is a cross-section along the A-A line of the power window switch 30 in FIG. 2A. The power window switch 30 is, for example, provided on the inner side of a door of the vehicle.

The power window switch 30 includes an operation interface 31 on which the user performs input operations. As illustrated in FIG. 2B, the operation interface 31 is supported at one end by a base 32 of a door armrest of the vehicle, for example, and extends in a direction parallel to the door. The direction in which the operation interface 31 extends is also referred to below as the extending direction. The operation interface 31 is, for example, configured by an elastic member that is deformable by an input operation from the user. The user can operate the operation interface 31 by pushing the operation interface 31 down from the upper surface 31a side towards the lower surface 31b side and by pulling up a tip 31c of the operation interface 31 with a finger. The state of the operation interface 31 in which the user is not performing an input operation is referred to below as the non-operation state.

As illustrated in FIG. 2B, the operation interface 31 includes the piezoelectric element 16 stacked on the lower surface 31b along the extending direction of the operation interface 31.

Figure 3:
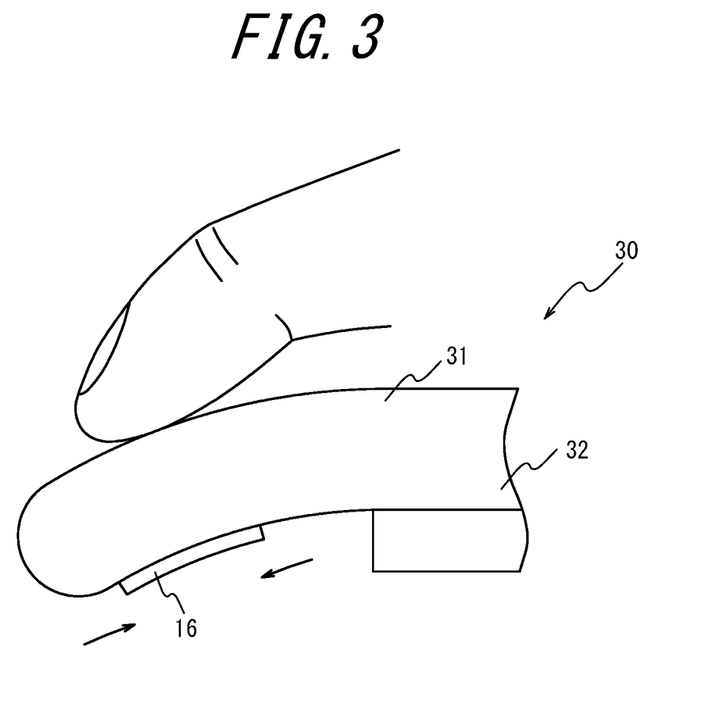
FIG. 3 schematically illustrates the power window switch in FIGS. 2A and 2B in a pushed-down state.

As illustrated in FIG. 3, when the user presses the operation interface 31 from the upper surface 31a side towards the lower surface 31b side, the tip 31c is pushed down from the non-operation state and the operation interface 31 bends. Compared to the non-operation state, the operation interface 31 in this case is lengthened (expanded) in the extending direction of the upper surface 31a and shortened (contracted) in the extending direction of the lower surface 31b by an elastic force. As a result, the piezoelectric element 16 provided on the lower surface 31b contracts. The operation interface 31 bends more as it is pushed down more firmly, causing the piezoelectric element 16 to contract more. When the piezoelectric element 16 is in a contracted state, a voltage signal indicating that the piezoelectric element 16 has contracted is output from the input detector 11 to the controller 12 as information related to the displacement state.

Figure 4:
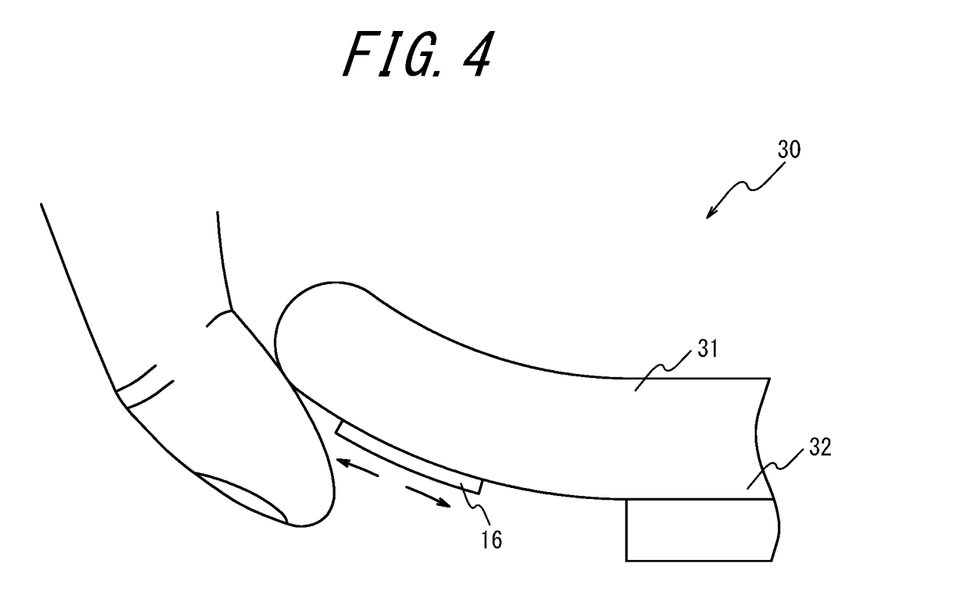
FIG. 4 schematically illustrates the power window switch in FIGS. 2A and 2B in a pulled-up state.

On the other hand, when the user pulls up the tip 31c of the operation interface 31 with a finger, the tip 31c is pulled up from the non-operation state and the operation interface 31 bends, as illustrated in FIG. 4. Compared to the non-operation state, the operation interface 31 in this case is shortened (contracted) in the extending direction of the upper surface 31a and lengthened (expanded) in the extending direction of the lower surface 31b by an elastic force. As a result, the piezoelectric element 16 provided on the lower surface 31b expands. The operation interface 31 bends more as it is pulled up more firmly, causing the piezoelectric element 16 to expand more. When the piezoelectric element 16 is in an expanded state, a voltage signal indicating that the piezoelectric element 16 has expanded is output from the input detector 11 to the controller 12 as information related to the displacement state. In this way, the input detector 11 provides different outputs when the piezoelectric element 16 expands and when the piezoelectric element 16 contracts.

Figure 5A:
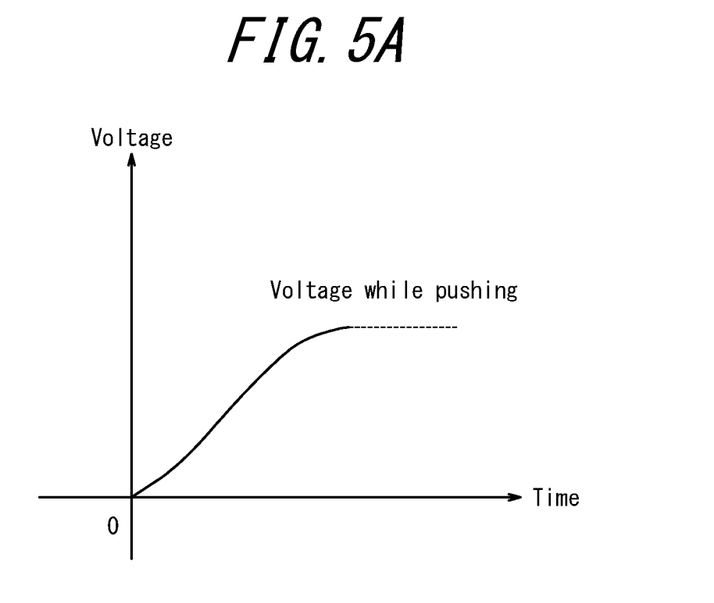
FIGS. 5A and 5B illustrate the relationship between an input operation by the user on an operation interface and a voltage signal output by a piezoelectric element.
Figure 5B:
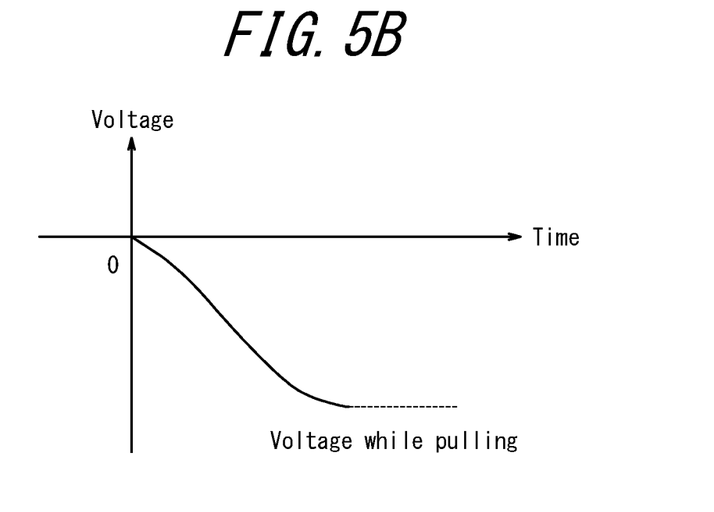

Here, the different control that the controller 12 performs in accordance with the voltage signal acquired from the input detector 11 is described. FIGS. 5A and 5B illustrate the relationship between the input operation by the user on the operation interface 31 and the voltage signal output by the piezoelectric element 16 (input detector 11). As an example, FIGS. 5A and 5B illustrate the case of a positive voltage signal being output when the piezoelectric element 16 contracts.

For example, when the operation interface 31 is pushed down (while pushing) as illustrated in FIG. 3, a positive voltage signal indicating that the piezoelectric element 16 has contracted as a result of a push operation by the user is output from the input detector 11, as illustrated in FIG. 5A. The input detector 11 outputs a higher voltage signal as the piezoelectric element 16 contracts more. On the other hand, when the operation interface 31 is pulled up (while pulling) as illustrated in FIG. 4, a negative voltage signal indicating that the piezoelectric element 16 has expanded as a result of a pull-up operation by the user is output from the input detector 11, as illustrated in FIG. 5B. The input detector 11 outputs a lower voltage signal as the piezoelectric element 16 expands more.

On the basis of a voltage signal acquired from the input detector 11, the controller 12 generates a control signal for controlling the power window of the vehicle. When acquiring a positive voltage signal, for example, the controller 12 generates a control signal (drive signal) for displacing the power window in the opening direction and outputs the control signal to a drive motor provided in the power window. The controller 12 may, for example, generate a control signal for displacing the power window faster as the absolute value of the acquired voltage is greater. The drive motor of the power window is driven in response to the control signal acquired from the controller 12. The power window is displaced in the opening direction by the drive motor being driven.

When acquiring a negative voltage signal, for example, the controller 12 generates a control signal for displacing the power window in the closing direction and outputs the control signal to the drive motor provided in the power window. The controller 12 may, for example, generate a control signal for displacing the power window faster as the absolute value of the acquired voltage is greater. The drive motor of the power window is driven in response to the control signal acquired from the controller 12. The power window is displaced in the closing direction by the drive motor being driven.

In this way, the controller 12 performs control to open and close the power window, which is the controlled apparatus 20, in accordance with the voltage signal from the input detector 11. When the voltage signal is input to the controller 12, the controller 12 may input the vibration signal generated by the vibration signal generator 13 to the vibration output interface 14. Once the vibration signal is input to the vibration output interface 14, the piezoelectric element 16 vibrates, thereby vibrating the operation interface 31. The vibration signal generator 13 may generate vibration signals with different patterns in accordance with the voltage signal from the input detector 11. As a result, the piezoelectric element 16 vibrates in different ways in accordance with the voltage signal from the input detector 11.

Figure 6:
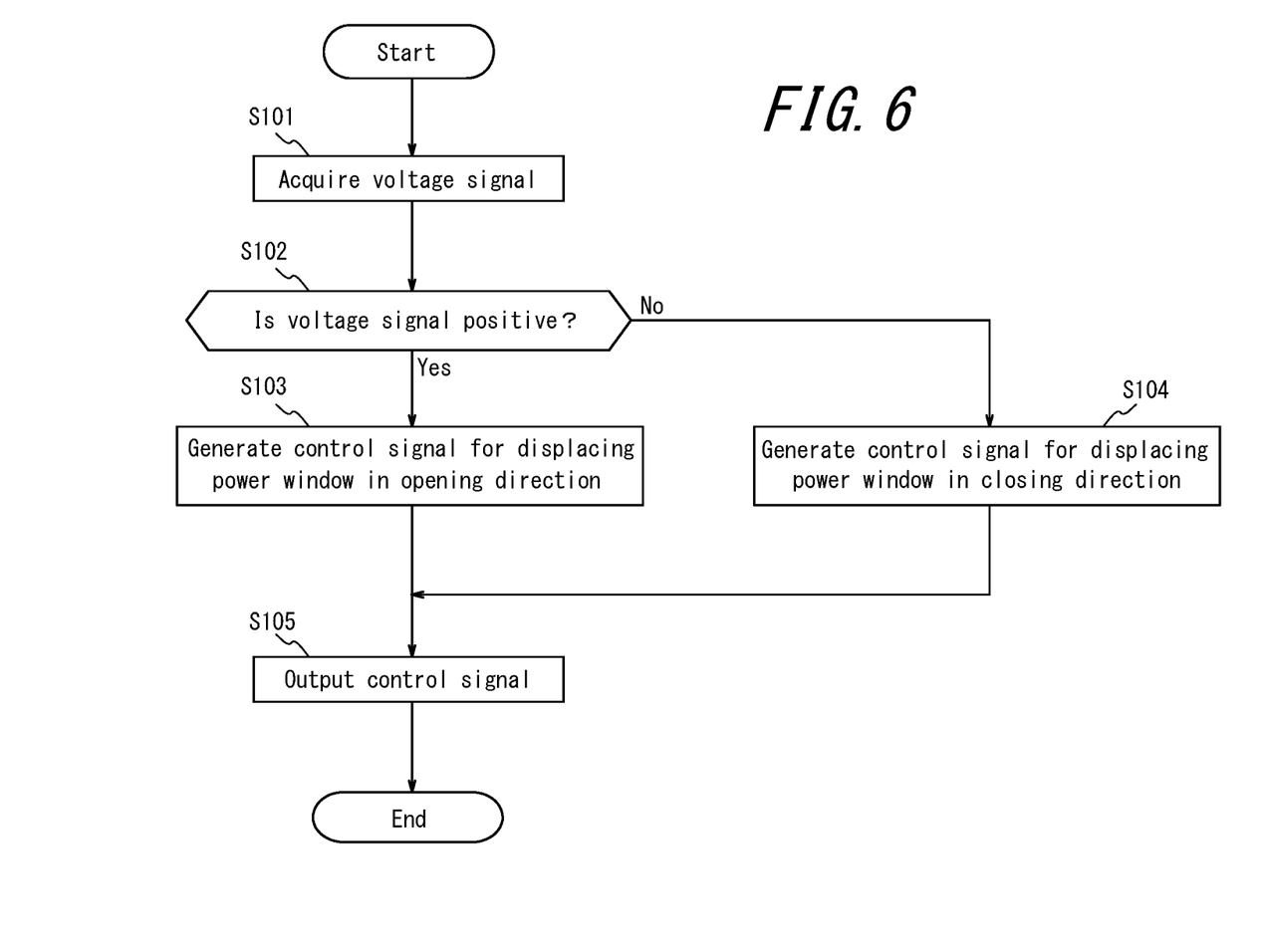
FIG. 6 is a flowchart illustrating an example of processing by the controller in FIG. 1.

Next, processing by the controller 12 is described. FIG. 6 is a flowchart illustrating an example of processing by the controller 12 in FIG. 1.

First, when the user performs an input operation on the operation interface 31, the input detector 11 outputs a voltage signal in accordance with the input operation. The controller 12 acquires the voltage signal output by the input detector 11 (step S101).

Next, the controller 12 judges whether the voltage signal acquired from the input detector 11 is a positive voltage signal or a negative voltage signal (step S102).

When it is judged that the voltage signal acquired from the input detector 11 is a positive voltage signal (step S102: Yes), the controller 12 generates a control signal for displacing the power window in the opening direction (step S103).

Conversely, when it is judged that the voltage signal acquired from the input detector 11 is a negative voltage signal (step S102: No), the controller 12 generates a control signal for displacing the power window in the closing direction (step S104).

After generating the control signal in step S103 or step S104, the controller 12 outputs the generated control signal to the drive motor of the power window (step S105).

In response to the control signal, the drive motor rotates in the positive or reverse direction, for example, to displace the power window in the opening direction or the closing direction.

In this way, the controller 12 in the input apparatus 10 according to the present embodiment performs different control to displace the power window in the opening direction or the closing direction in accordance with positive and negative voltage signals acquired from the piezoelectric element 16 (input detector 11). Therefore, the input apparatus 10 allows a reduction in the number of input detectors 11 (piezoelectric elements 16) as compared, for example, to the case of providing an input apparatus with different input detectors 11 for different types of control to displace the power window in the opening direction or the closing direction. When controlling a power window as described in the above embodiment by performing two types of control, in the opening direction and the closing direction, the input apparatus 10 can achieve these two types of power window control using one piezoelectric element 16. The manufacturing cost of the input apparatus 10 can be reduced by this reduction in the number of elements.

The controller 12 changes the output in accordance with the magnitude of displacement of the piezoelectric element 16. In other words, the controller 12 generates a control signal for displacing the power window faster as the amplitude of the voltage signal acquired from the input detector 11 is greater. Hence, the user can cause control to be executed to open the power window faster by pushing the operation interface 31 down more firmly and cause control to be executed to close the power window faster by pulling the operation interface 31 up more firmly. Conversely, the user can cause control to be executed to open the power window more slowly by pushing the operation interface 31 down more weakly and cause control to be executed to close the power window more slowly by pulling the operation interface 31 up more weakly. The input apparatus 10 allows the opening and closing operation of the power window to follow the input operation to the operation interface 31 in an analog manner. Therefore, the input apparatus 10 facilitates the operation of the controlled apparatus 20 in accordance with the user's desire. This makes it easier for the user to make minute adjustments by operating the switch to displace the piezoelectric element 16 slightly when opening or closing the power window, for example. The input apparatus 10 thus improves operability.

The above embodiment is provided as an example, and a variety of modifications and changes are possible. For example, the functions and the like included in the various components and steps may be reordered in any logically consistent way. Furthermore, components or steps may be combined into one or divided.

For example, the input apparatus 10 has been described in the above embodiment as being applied to a power window switch 30, but the input apparatus 10 can be used in other applications.

For example, the input apparatus 10 can be used as a switch for controlling an electric reclining chair. An electric reclining chair is, for example, provided with a drive motor for reclining and raising the backrest. When using the input apparatus 10 as a switch for controlling an electric reclining chair, the switch can be structured in the same way as the one in FIGS. 2A and 2B, for example. In this case, when the piezoelectric element 16 expands due to the user pulling up the operation interface 31, the controller 12 outputs a control signal for reclining the backrest of the reclining chair to the drive motor on the basis of a voltage signal acquired from the piezoelectric element 16. On the other hand, when the piezoelectric element 16 contracts due to the user pushing down the operation interface 31, the controller 12 outputs a control signal for raising the backrest of the reclining chair to the drive motor on the basis of a voltage signal acquired from the piezoelectric element 16. The controller 12 can generate control signals with different reclining speeds in accordance with the magnitude of the absolute value of the voltage signal. The input apparatus 10 thereby facilitates the operation of the controlled apparatus 20 in accordance with the user's desire.

Furthermore, the input apparatus 10 can, for example, be used as a switch for controlling a power seat in which the seat position and the angle of the backrest can be changed. In this case as well, the controller 12 generates a control signal for controlling the power seat in the forward/backward or left/right directions, for example, in accordance with the polarity of voltage output by the piezoelectric element 16 provided in the operation interface 31.

The input apparatus 10 can also be used in a variety of applications other than the above example. In particular, the input apparatus 10 is appropriate as a switch of a controlled apparatus that moves reciprocally in predetermined directions, as in the above example.

In the above embodiment, the input detector 11 may, for example, change the amplitude of the voltage signal in accordance with the acceleration of displacement (expansion or contraction) of the piezoelectric element 16. In this case, the input detector 11 supplies the controller 12 with a voltage signal having an amplitude corresponding to acceleration. The controller 12 determines the speed, for example, at which to displace the power window as in the above embodiment in accordance with the supplied voltage signal.

Furthermore, the position at which the piezoelectric element 16 is disposed in the operation interface 31 is not limited to the lower surface 31b. The piezoelectric element 16 can be disposed at any position allowing expansion and contraction in accordance with operation of the operation interface 31 by the user. In the example illustrated in FIGS. 2A and 2B, the piezoelectric element 16 may, for example, be provided on the upper surface 31a or inside the operation interface 31.

The invention claimed is:

1. An input apparatus comprising:
a memory and a processor that is programmed to execute a program stored in the memory that allows the processor to:
receive, via an operation interface, an input operation from a user;
a piezoelectric element attached to the operation interface; and
the processor further programed to acquire output based on the input operation to the operation interface from the piezoelectric element and to execute different control with respect to a control switch for a controlled device movable in two opposite directions in accordance with the output,
wherein the control switch is configured to be bent in two opposite directions by pulling or pushing an end tip portion thereof.

2. The input apparatus of claim 1, wherein the processor is further programmed to execute the different control in accordance with a polarity of voltage output from the piezoelectric element.

3. The input apparatus of claim 2, wherein the processor is further programmed to determine a speed of the control with respect to the control switch for a power window in accordance with the magnitude of the voltage.

4. The input apparatus of claim 1, wherein the processor is further programmed to provide a tactile sensation to the user by causing the piezoelectric element to expand and contract when the processor acquires the output from the piezoelectric element.

5. An input method for an input apparatus comprising an operation interface configured to receive an input operation from a user, a piezoelectric element attached to the operation interface, and a controller, the input method comprising:
acquiring, using the controller, output based on the input operation to the operation interface from the piezoelectric element; and
executing different control with respect to a control switch for a controlled device movable in two opposite directions in accordance with the output,
wherein the control switch is configured to be bent in two opposite directions by pulling or pushing an end tip portion thereof.

* * * * *